United States Patent
Sridharan

(10) Patent No.: US 7,979,046 B2
(45) Date of Patent: *Jul. 12, 2011

(54) TRANSCEIVER DEVELOPMENT IN VHF/UHF/GSM/GPS/BLUETOOTH/ CORDLESS TELEPHONES

(75) Inventor: Guruswami Sridharan, San Diego, CA (US)

(73) Assignee: Orca Systems, Inc., Poway, CA (US)

( * ) Notice: Subject to any disclaimer, the term of this patent is extended or adjusted under 35 U.S.C. 154(b) by 216 days.

This patent is subject to a terminal disclaimer.

(21) Appl. No.: 12/334,358

(22) Filed: Dec. 12, 2008

(65) Prior Publication Data

US 2009/0147884 A1   Jun. 11, 2009

Related U.S. Application Data

(63) Continuation of application No. 11/357,472, filed on Feb. 17, 2006, now Pat. No. 7,519,349.

(51) Int. Cl.
 *H04B 1/10* (2006.01)
(52) U.S. Cl. ........................... 455/302; 455/326
(58) Field of Classification Search ............... 455/190.1, 455/207–209, 285, 302, 303, 304, 323, 324, 455/330, 333, 326; 375/316, 346, 350
See application file for complete search history.

(56) References Cited

U.S. PATENT DOCUMENTS

| | | |
|---|---|---|
| 4,609,881 A | 9/1986 | Wells |
| 5,038,117 A | 8/1991 | Miller |
| 5,053,728 A | 10/1991 | Bogl |
| 5,055,800 A | 10/1991 | Black et al. |
| 5,055,802 A | 10/1991 | Hietala et al. |
| 5,070,310 A | 12/1991 | Hietala et al. |
| 5,093,632 A | 3/1992 | Hietala et al. |
| 5,111,162 A | 5/1992 | Hietala et al. |
| 5,146,186 A | 9/1992 | Vella |
| 5,266,907 A | 11/1993 | Dacus |
| 5,430,890 A | 7/1995 | Vogt et al. |
| 5,446,767 A | 8/1995 | Nakagawa et al. |
| 5,563,535 A | 10/1996 | Corry et al. |
| 5,604,468 A | 2/1997 | Gillig |
| 5,757,239 A | 5/1998 | Gilmore |
| 5,777,521 A | 7/1998 | Gillig et al. |
| 5,790,612 A | 8/1998 | Chengson et al. |
| 5,802,463 A | 9/1998 | Zuckerman |

(Continued)

FOREIGN PATENT DOCUMENTS

JP 4-212522 A0 8/1992

(Continued)

OTHER PUBLICATIONS

Crols, Jan et al., "Low-IF Topologies for High-Performance Analog Front Ends of Fully Integrated Receivers," IEEB Transactions on Circuits and Systems—II: Analog and Digital Signal Processing, Mar. 1998, pp. 269-282, vol. 45, No. 3.

(Continued)

*Primary Examiner* — Thanh C Le
(74) *Attorney, Agent, or Firm* — Foley & Lardner LLP

(57) ABSTRACT

A digital communication circuit can be implemented can be implemented in a CMOS, or other IC structure. The digital circuit can utilize negative frequency removers or image frequency removers in the digital domain. The circuit can include mixers, switches, a complex filter, a low noise amplifier and summers. The image frequency can be removed digitally.

20 Claims, 8 Drawing Sheets

U.S. PATENT DOCUMENTS

| | | | |
|---|---|---|---|
| 5,894,592 A | 4/1999 | Brueske et al. |
| 5,920,233 A | 7/1999 | Denny |
| 6,008,703 A | 12/1999 | Perrott et al. |
| 6,008,704 A | 12/1999 | Opsahl et al. |
| 6,047,029 A | 4/2000 | Eriksson et al. |
| 6,066,989 A | 5/2000 | Knecht et al. |
| 6,094,101 A | 7/2000 | Sander et al. |
| 6,094,569 A | 7/2000 | Wang |
| 6,172,579 B1 | 1/2001 | Dacus et al. |
| 6,219,397 B1 | 4/2001 | Park |
| 6,236,703 B1 | 5/2001 | Riley |
| 6,321,075 B1 | 11/2001 | Butterfield |
| 6,326,851 B1 | 12/2001 | Staszewski et al. |
| 6,359,950 B2 | 3/2002 | Gossmann et al. |
| 6,404,291 B1 | 6/2002 | Riley |
| 6,414,555 B2 | 7/2002 | Staszewski et al. |
| 6,429,693 B1 | 8/2002 | Staszewski et al. |
| 6,429,707 B1 | 8/2002 | Lamb et al. |
| 6,433,643 B1 | 8/2002 | Opsahl et al. |
| 6,483,388 B2 | 11/2002 | Khan |
| 6,504,437 B1 | 1/2003 | Nelson et al. |
| 6,504,498 B1 | 1/2003 | O'Brien |
| 6,515,553 B1 | 2/2003 | Filiol et al. |
| 6,525,609 B1 | 2/2003 | Behzad |
| 6,542,044 B1 | 4/2003 | Berquist et al. |
| 6,553,089 B2 | 4/2003 | Huh et al. |
| 6,570,452 B2 | 5/2003 | Sridharan |
| 6,597,250 B2 | 7/2003 | Jovenin |
| 6,600,378 B1 | 7/2003 | Patana |
| 6,614,319 B2 | 9/2003 | Saeki et al. |
| 6,670,854 B2 | 12/2003 | Takeda et al. |
| 6,690,215 B2 | 2/2004 | Mccune et al. |
| 6,693,494 B2 | 2/2004 | Fan |
| 6,704,908 B1 | 3/2004 | Horan et al. |
| 6,707,855 B2 | 3/2004 | Patana |
| 6,708,026 B1 | 3/2004 | Klemmer et al. |
| 6,710,664 B2 | 3/2004 | Humphreys et al. |
| 6,710,951 B1 | 3/2004 | Cloke |
| 6,717,998 B2 | 4/2004 | Adachi et al. |
| 6,734,741 B2 | 5/2004 | Staszewski et al. |
| 6,791,422 B2 | 9/2004 | Staszewski et al. |
| 6,822,593 B2 | 11/2004 | Level et al. |
| 6,823,033 B2 | 11/2004 | Fahim |
| 6,825,729 B2 | 11/2004 | Splett |
| 6,829,311 B1 | 12/2004 | Riley |
| 6,834,183 B2 | 12/2004 | Black et al. |
| 6,836,526 B2 | 12/2004 | Rana |
| 6,838,951 B1 | 1/2005 | Nieri et al. |
| 6,844,758 B2 | 1/2005 | Smith |
| 6,844,836 B1 | 1/2005 | Lee |
| 6,873,213 B2 | 3/2005 | Tsuda et al. |
| 6,897,796 B2 | 5/2005 | Dias et al. |
| 6,931,243 B2 | 8/2005 | Goldman |
| 6,933,798 B2 | 8/2005 | Hammes et al. |
| 6,941,116 B2 | 9/2005 | Jensen et al. |
| 6,941,330 B2 | 9/2005 | Jackson et al. |
| 6,946,884 B2 | 9/2005 | Holland et al. |
| 6,946,915 B2 | 9/2005 | Zhang |
| 6,952,138 B2 | 10/2005 | Hagberg et al. |
| 7,031,686 B2 * | 4/2006 | Kim et al. ............... 455/285 |
| 7,146,144 B2 | 12/2006 | Robinson et al. |
| 7,482,885 B2 | 1/2009 | Sridharan |
| 7,519,349 B2 | 4/2009 | Sridharan |
| 2002/0168038 A1 | 11/2002 | Damgaard et al. |
| 2004/0066240 A1 | 4/2004 | Staszewski et al. |
| 2006/0141969 A1 * | 6/2006 | Dubash et al. ............ 455/285 |
| 2007/0099588 A1 * | 5/2007 | Konchistky ............ 455/190.1 |

FOREIGN PATENT DOCUMENTS

| | | |
|---|---|---|
| JP | 2001-237709 A0 | 8/2001 |
| WO | WO-97/06600 A1 | 2/1997 |

OTHER PUBLICATIONS

Karvonen S. et al., "A Low Noise Quadrature Subsampling Mixer," Proc. Of the ISCAS, 2001, pp. 790-793.

Lyons, Richard, "Representing Real Signals Using Complex Phasors," Understanding Positive & Negative Frequency, date unknown, pp. 462-471.

Muhammad, K. et al., "A Discrete-Time Bluetooth Receiver in a 0.13μm Digital CMOS Process," IEEE International Solid-State Circuits Conference, Feb. 17, 2004, 10 pages, Session 15.

Muhammad, K. et al., "Direct Sampling Mixer with Recursive Filtering in Charge Domain," May 2004, pp. 577-580, IEEE Int. Symposium on Circuits and Systems, ASP-L29.5.

Rudell, Jacques C. et al., "A 1.9-GHz Wide-Band IF Double Conversion CMOS Receiver for Cordless Telephone Applications," IEEE Journal of Solid-State Circuits, December 12, 1997, pp. 2071-2088, vol. 32, No. 12.

International Search Report for International Application No. PCT/US2006/049330; mailed Jul. 25, 2007; 3 pages.

* cited by examiner

TRANSCEIVER DEVELOPMENT IN VHF/UHF/GSM/GPS/BLUETOOTH/CORDLESS TELEPHONES

CROSS-REFERENCE TO RELATED PATENT APPLICATIONS

The present application is a Continuation of U.S. application Ser. No. 11/357,472, filed on Feb. 17, 2006, entitled "Transceiver Development in VHF/UHF/GSM/GPS/BlueTooth/Cordless Telephones" by Sridharan, incorporated herein by reference in its entirety.

BACKGROUND OF THE INVENTION

The present application generally relates to communication circuits and systems. More specifically, the present application relates to a receiver or transmitter using image frequency rejection and negative(or positive) frequency rejection in the digital domain.

Radio frequency (RF) reception is often utilized in various mobile communication equipment (e.g., cordless telephones, VHF, UHF, bluetooth, global positioning systems (GPS), computers, handheld computers, satellite radios, etc.). RF reception often requires that an incoming signal (such as a high frequency signal (e.g., 1.5 gigahertz)) be selected with respect to various unwanted other signals.

The incoming signal generally has information encoded upon it and often has a signal level that is extremely low. To obtain the encoded information from the incoming signal, the incoming signal is converted to a lower frequency and its signal level is increased so that a demodulator or an analog-to-digital converter can obtain the encoded information. Accordingly, most conventional receiver architectures process the incoming signal by amplifying the incoming signal to an appropriate level and removing unwanted interfering signals before providing the incoming signal to the demodulator or analog-to-digital converter. This process is preferably done without introducing much distortion. Further, in battery operated devices, all these functions are preferably achieved with minimal power consumption.

In conventional receivers, RF reception is often accomplished by analog super-heterodyne receivers. These receivers down convert the radio frequency (RF) signal to one or more lower, intermediate frequency (IF) signals using analog components. U.S. Pat. No. 5,802,463 discusses conventional super-heterodyne receivers and direct conversion receivers.

The IF signals have fixed, or at least restricted, frequencies which allow the IF signals to be more easily filtered, amplified, and otherwise processed. In conventional super-heterodyne receivers, an antenna provides RF signals which are fed into a band pass RF filter which selectively passes only the RF signals (both desired and otherwise) and noise within a bandwidth of interest while attenuating other RF signals and noise outside this bandwidth, thereby reducing the necessary dynamic range of the succeeding stages. The band-limited RF signals and noise are then amplified by a low noise amplifier (LNA).

Power consumption of the amplifier can be reduced if it is preceded by filters which remove unwanted interference. To assist the RF filter in attenuating electrical noise and signals that are amplified by the LNA and fall within the image frequency band—which are especially critical because they can pass unfiltered through the intermediate frequency (IF) section—amplified RF signal from the LNA is filtered by an image filter. A mixer mixes the amplified RF signal with a local oscillator (LO) frequency signal to convert the band-limited RF signals to an IF band along with undesired mixing products.

The IF signals from the mixer are generally coupled to an IF filter, which passes mainly the sub-band containing the desired signals. This (and any succeeding) IF filter passes without further attenuation the remnants of any undesired signals and noise present in the image sub-band of the image band which were insufficiently filtered by the RF filter and image filter.

In the process of propagation through the IF filters and amplifiers, the desired IF signal present in the sub-band passed by the filters is selected in favor of signals and noise present at other sub-bands in the IF. The selected IF signal is typically demodulated and translated into a base-band information signal for use by the communications control system. Many variations of the analog super-heterodyne design exist.

One disadvantage of the conventional analog super-heterodyne design is that it cannot easily be fully integrated onto an integrated circuit (IC, or microchip). Most super-heterodyne receivers require significant pre-conversion filters and high quality narrow band IF filters which operate at high frequencies and are comprised of analog components. Accordingly, the analog nature of super-heterodyne receivers results in a larger size, higher cost, and higher power consumption.

The trade-off governing the image-reject filters has motivated designers to seek other methods of suppressing the image. One such method uses a Hartley architecture. An example of a conventional Hartley analog circuit 1000 applied to Direct Conversion Architecture is shown in Figures IA. With reference to FIG. 1A, Hartley circuit 1000 mixes an RF input with the quadrature phases of the Local Oscillator (LO), Cos(ct) and Sin (ωt), low-pass filters the resulting signals and shifts one by 90 degrees before summing the resulting signals together. The Cos (wt) and Sin (wt) signals are at the LO frequency. Circuit 1000 includes analog mixers 1020A-B, an amplifier 1018, analog filters 1022A-B, an analog phase delay circuit 1026, and an analog summer 1028. When the LO frequency is same as RF frequency, the resulting IF is zero.

Since $e(jwt)=[\cos(wt)+j\sin(wt)]/2$, the process of FIG. 1A can be thought of as multiplying the input by a single positive (or negative) frequency LO. Multiplying in time domain is equivalent to convolution in frequency domain.

In the resulting IF, wanted and image frequencies are separated as positive and negative frequencies. Following Hilbert filter removes the image. Note that shifting by 90 deg. and adding is equivalent to Hilbert filter. On the other hand, if frequency of LO is different from RF frequency then, the wanted and image frequencies are down-converted around an IF. An example waveform for a GSM Low IF scheme is shown in FIG. 1B. A complex band-pass filter (represented by the dashed line in FIG. 1B) then removes the image.

In essence, when the input is real, image is separated by multiplying it with a single complex frequency. Not only image is removed but all the negative (or positive) frequencies are also suppressed; in other words, suppressed image band is very wide.

The same principle can be applied when the input is complex. To realize multiplication of two complex quantities, more operations need to be performed. As shown in FIG. 2, four multiplications (Mixers) and two Summations (since subtraction can be viewed as summation of a negative quantity) are required for a complex multiplication. FIG. 2 implements the following equation: $(A+jB)*(C+jD)=(AC-BD)+j(AD+BC)$. See, "Low IF Topologies for High Performance Analog Front-Ends of Fully Integrated Receivers" IEEE Transactions on Circuits and Systems-II Analog and Digital Signal Processing, Vol. 45, No. 3, March 1998.

It should be noted that, the same concept of image reject architecture is equally valid in a transmit mode. In general, the transmit mode involves an up-convert scheme from an IF. Similar complex multiplication with LO can translate the IF to an RF band.

Subsequently, designers have tried to reduce the analog circuits and do more in digital domain. Some techniques have used sampling mixers and discrete signal processing.

Certain articles have discussed RF sampling mixer architectures that utilize digital filtering and digital base-band down conversion. These articles include: K. Muhammad et al., "A Discrete-time Bluetooth Receiver in a 0.13 um Digital CMOS Process," Proc., of IEEE Solid-state Circuits Conf., sec. 15.1, pp 268-269, 527, February 2004; K. Muhammad and R. B. Staszewski, "Direct RF Sampling Mixer-with Recursive Filtering in Charge Domain," Proc., of 2004 IEEE Intl. Symp. on Circuits and Systems., sec., ASP-L29.5, May 2004; S. Karvonen et al., "A Low Noise Quadrature Subsampling Mixer," Proc., of the ISCAS, pp 790-793, 2001. Processing in the digital domain using sampling mixers to down convert the signal followed by a chain of digital filters has been proposed for receiver architectures. Each digital filter is designed to reject as much as possible of unwanted frequencies, without distorting the desired signal. First two listed articles mainly concentrate on using a chain of FIR low-pass filters. The last listed article proposes complex filters after input is down converted to an IF and using sub-sampling techniques.

There is a need for a receiver that is more compatible with digital designs. Further still, there is a need for a receiver that does not utilize a conventional analog design. Further still, there is a need for a digital receiver capable of higher selectivity, sensitivity and fidelity using digital logic devices. Further still, there is a need for a receiver architecture that is low cost, has a small area and has low power consumption when compared to conventional analog-intensive designs. Yet further still, there is a need for a digital receiver optimized for image separation followed by complex filtering.

SUMMARY OF THE INVENTION

An exemplary embodiment relates to a digital receiver. The digital receiver includes an amplifier and sampling mixers coupled to receive an A signal and a jB signal from the amplifier. The mixers can include a first pair of mixers of the mixers receiving a C local oscillator signal and a second pair of mixers receiving a jD local oscillator signal. The jD local oscillator signal is phase delayed with respect to the C local oscillator signal. Alternatively, the mixers can be coupled to receive a local oscillator signal and have outputs coupled to a plurality of first switches and a plurality of second switches. The first switches receive a C control signal derived from the local oscillator signal and the second switches receive a jD control signal derived from the oscillator signal. The C control signal is phase delayed with respect to the jD control signal. The receiver can includes integration devices, such as capacitors, coupled to receive resultant signals from the mixers. The receiver also includes summers coupled to the integration devices. The summers provide a first sum of AC−BD and a second sum of BC+AD.

Another exemplary embodiment relates to a digital circuit for wireless applications. The digital circuit includes an amplifier; at least a pair of digital sampling mixers comprising a first mixer and a second mixer, and a set of sampling capacitors. The first mixer has a first input and a second input coupled to receive a first local oscillator signal, and the second mixer has a first input and a second input coupled to receive a second local oscillator signal. The set of sampling capacitors are coupled between ground and a respective mixer of the mixers. The circuit also includes digital summers coupled to the set of capacitors and a digital complex filter coupled to the summers. The circuit utilizes negative frequency removal for image rejection.

Still another exemplary embodiment relates to a digital communication circuit. The circuit includes means for complex multiplying an A signal, a jB signal, and a C local oscillator signal and a jD local oscillator signal, wherein the C local oscillator signal is phase delayed with respect to the jD local oscillator signal. The circuit also includes means for providing an average AC signal, an average AD signal, an average BD signal and an average BC signal. The circuit also includes means for providing a first sum of the average AC signal and the average BD signal and a second sum of the average BC signal and the average AD signal, and means for receiving the first sum and the second sum and providing an image free output signal.

According to one exemplary aspect, the summers provide a first sum of AC−BD and a second sum of BC+AD. The summers' outputs represent the RF input multiplied by complex LO. Complex multiplication with LO allows more efficient separation of the wanted and image frequencies. Complex band pass filtering can completely remove the image.

BRIEF DESCRIPTION OF THE DRAWINGS

Preferred exemplary embodiment will hereinafter be described in conjunction with the appended drawings, wherein like numerals denote like elements and.

DETAILED DESCRIPTION OF PREFERRED EMBODIMENTS

Figure 1A:
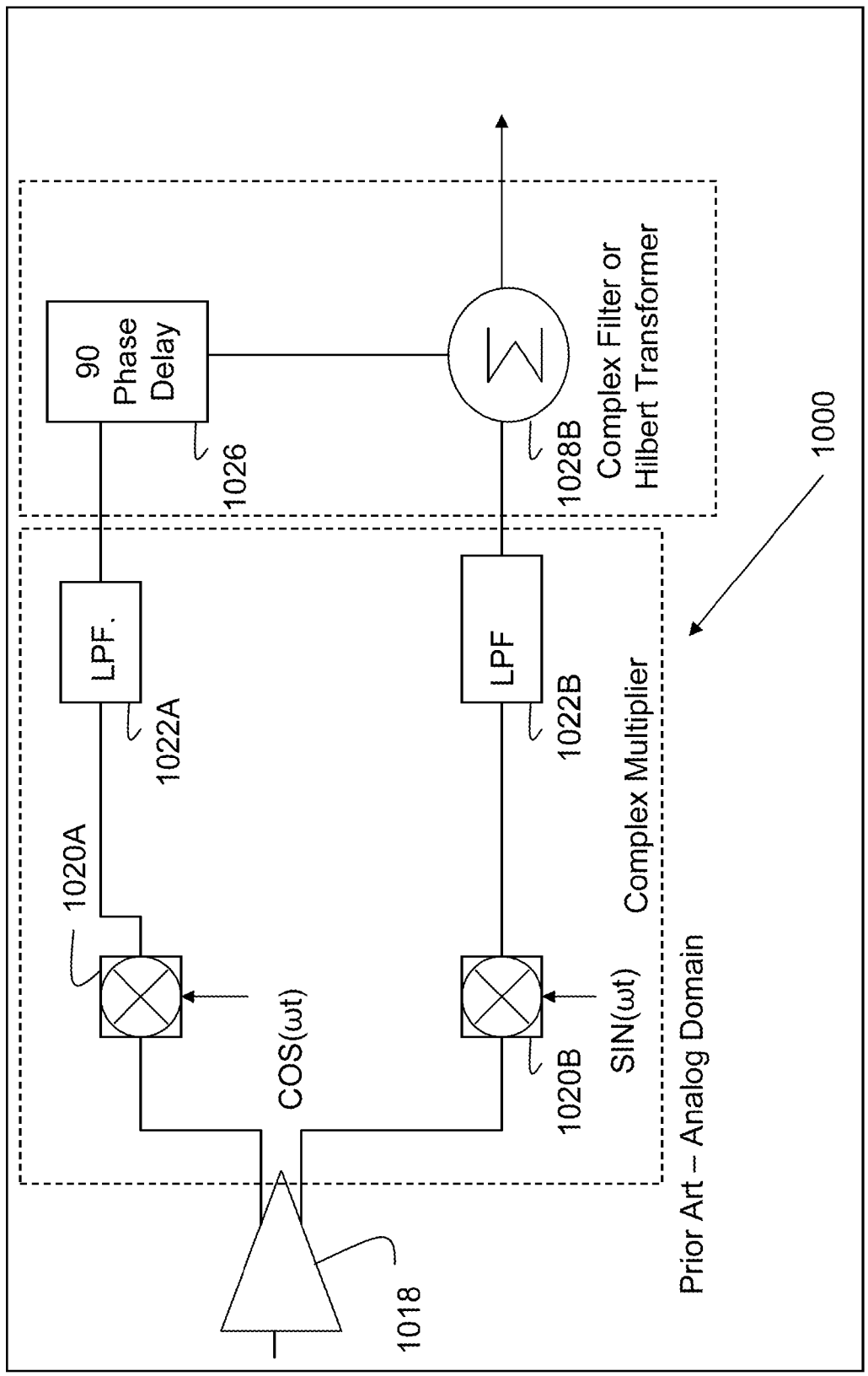
FIG. 1A is an electrical schematic general block diagram of image reject receiver architecture in prior art.
Figure 1B:
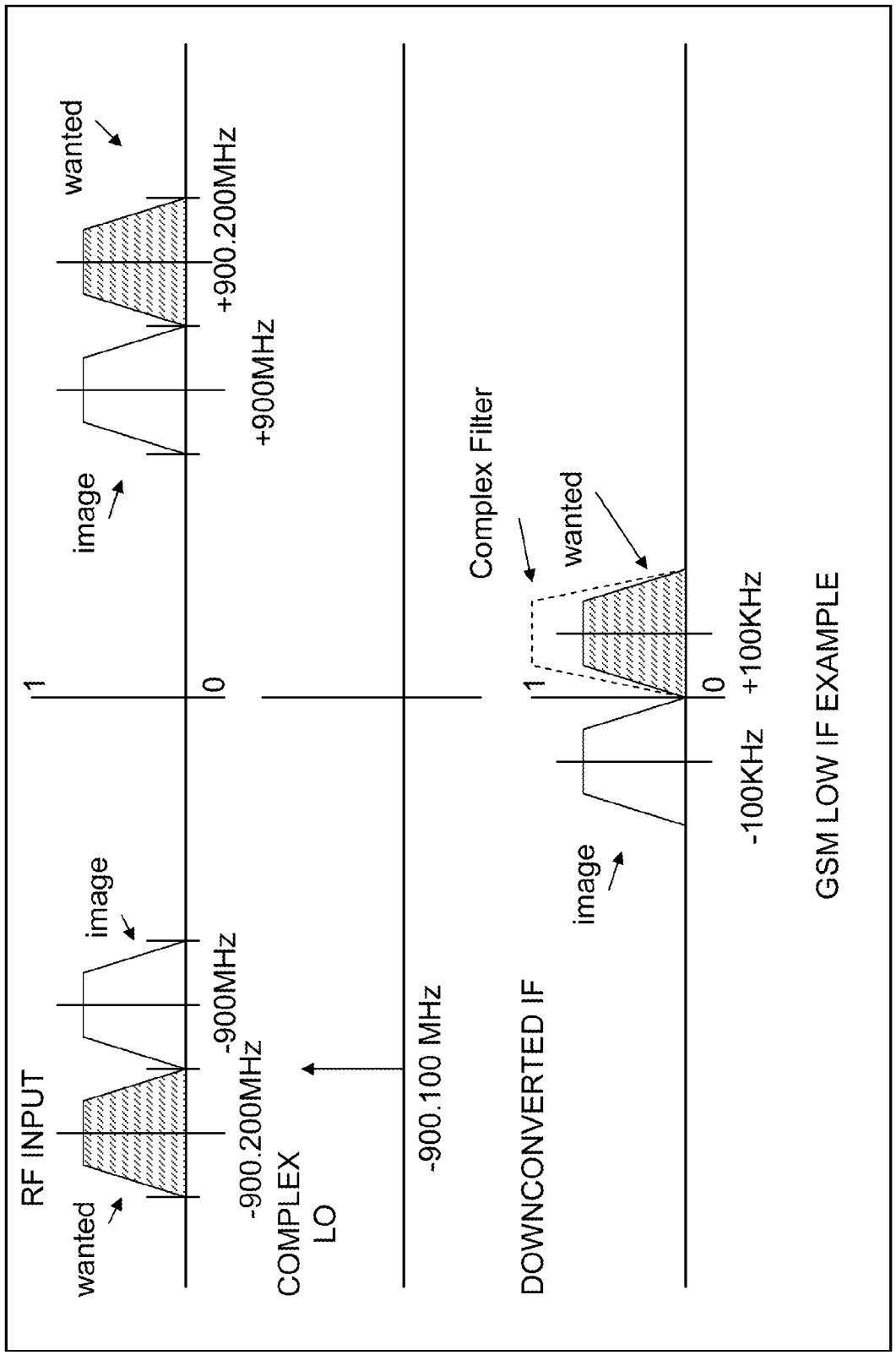
FIG. 1B is a set of waveform diagrams associated with the architecture illustrated in FIG. 1A.
Figure 2:
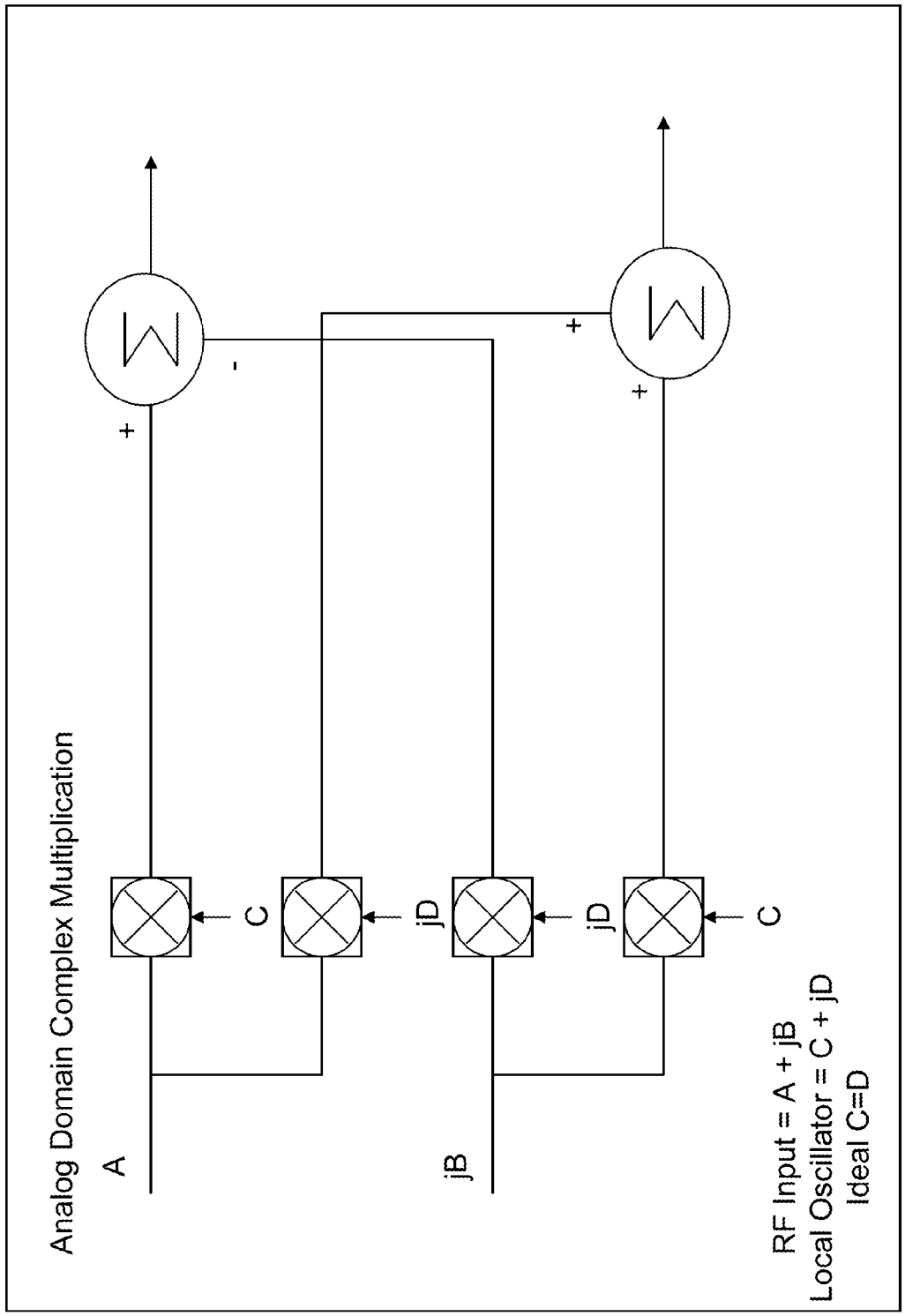
FIG. 2 is an electrical schematic general block diagram, in prior art, of a complex multiplier when the input is also complex.
Figure 3:
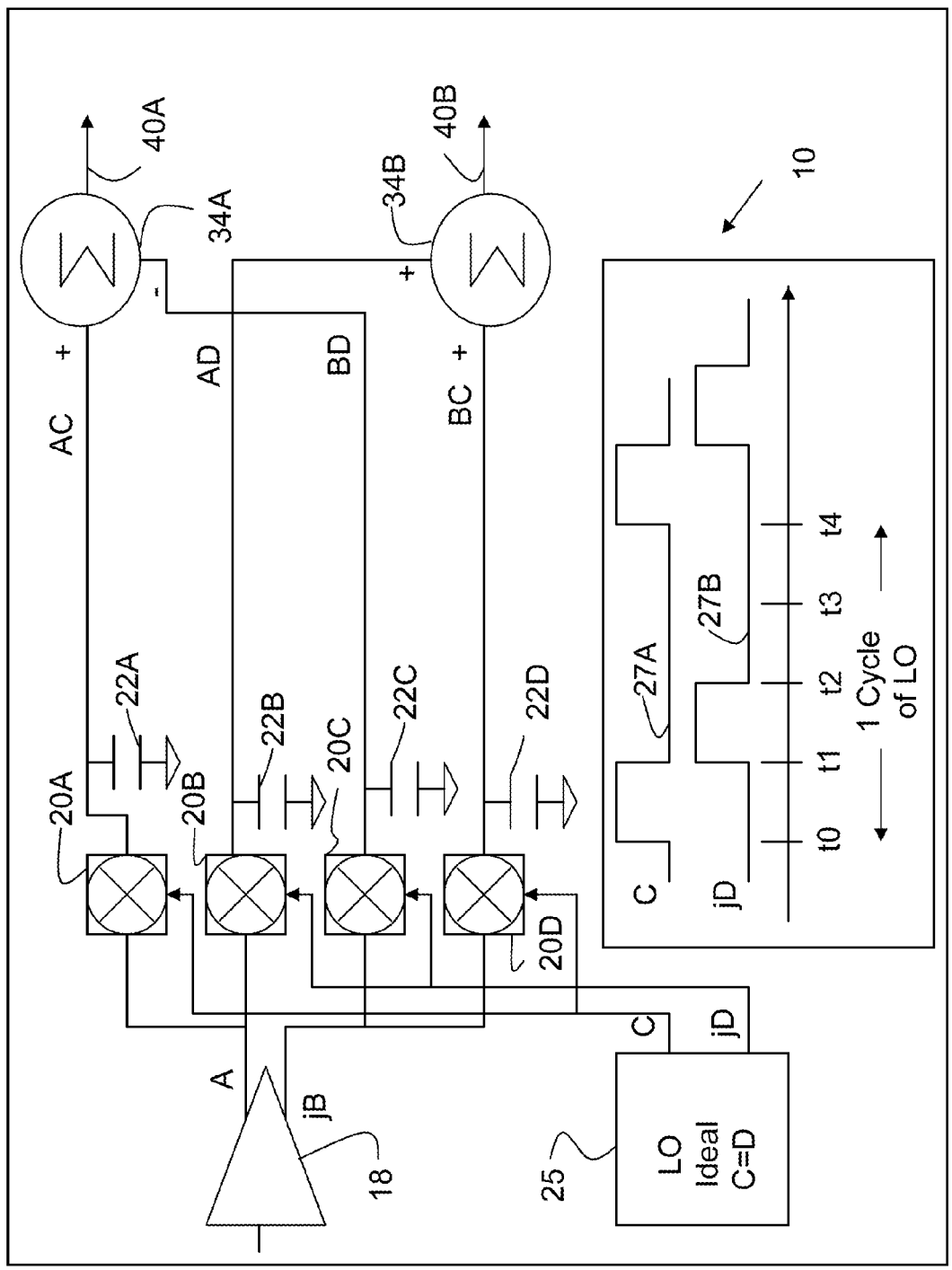
FIG. 3 is an electrical schematic general diagram of a digital receiver in accordance with an exemplary embodiment.

With reference to FIG. 3, a communication system includes a digital receiver 10. Digital receiver 10 preferably is implemented digitally to provide small area, and superior performance. Receiver 10 is an implementation of image separation, by complex multiplication using a four mixer solution, in digital domain, using sampling mixers and discrete signal processing (FIG. 3). Using four sampling mixers may increase power consumption; but in certain applications like VHF/UHF airborne transceivers performance is more important than power consumption. The image rejection that is obtained in this method is large, mainly due to: 1. choosing a high IF and 2. the rejection provided by the roofing filter augments the total image rejection.

Receiver 10 can be utilized in any communication application, such as, for use in a transceiver for VHF, UHF, GSM, GPS, bluetooth or cordless telephony. In preferred embodiments, receiver 10 utilizes a 4 mixer architecture to process an intermediate frequency (IF). Advantageously, receiver 10 can utilize complex multiplication to achieve image separation in the completely digital domain using discrete signal processing.

Applicant believes that very large image rejection over a broad band can be achieved using the advantageous architecture. In addition, the advantageous architecture is amenable to easily implement complex band-pass filtering after image separation.

Digital receiver 10 is comprised of an amplifier 18, four mixers, 20A-D, quadrature LO driver 25, four sampling capacitors 22A-D, and two summer circuits 34A-B. Mixers 20A-D are preferably sampling mixers. Amplifier 18 preferably has a first output coupled to an input of mixers 20A-B and a second output coupled to an input of mixers 20C-D. Mixers 20A-B each include a local oscillator input.

Capacitors 22A-D are each coupled between ground and a respective node between mixers 20A-D and summer circuits 34A-B. The outputs of mixer circuits 20A and 20C are coupled to respective inputs of summer circuit 34A, and the outputs of mixer circuits 20B and 20D are coupled to respective inputs of summer circuit 34B.

Amplifier 18 is preferably a low noise amplifier (LNA) and coupled to receive signals from an antenna (not shown). The signals from the antenna can be radio frequency (RF) signals. In one embodiment, a 2400 MHz Quadrature Amplitude Modulated (QAM) signal is received by the antenna, although receiver 10 can be utilized with any type of RF signal at any frequency that can be digitally processed.

Amplifier 18 preferably includes a phase shifting network for providing I and Q versions of the RF signal. Amplifier 18 preferably provides the I and Q versions as current signals which are proportional to the input voltage associated with the RF signal. Amplifier 18 has a first output (the output for the I current output signal, e.g., the A signal) coupled to mixers 20A and 20B and a second output (the output for the Q current signal (e.g., the jB signal)) coupled to mixers 20C and 20D.

The two outputs from amplifier 18 (LNA) are phase separated by 90° and the output currents are proportional to the input voltage. By converting into currents, a digital sampling mixer can charge a sampling capacitor for a duration determined by LO and thereby producing a charge proportional to RF input times the LO. Charge mode is advantageous since basic mathematical operation like addition, subtraction and integration can be realized in an efficient way. For example, addition is achieved by adding a charge on the same capacitor at a different time point. Integration is achieved by adding weighted charges multiple times on the same capacitor. Subtraction can be realized in differential mode operation.

Mixers 20A-D are utilized to down convert the RF signals (e.g., the I and Q signals) to a lower frequency such as an IF. Mixers 20A-D can be digital sampling mixers and include an input coupled to amplifier 18 and another input coupled to receive a local oscillator signal.

Local oscillator (LO) waveforms are shown in FIG. 3 as waveform 27A (e.g., C) and waveform 27B (e.g. jD, where C=D in an ideal circuit). A simple divide-by-four circuit can be used to provide quadrature phases (C and jD) of LO. Mixers 20A-D provide an output signal to sampling capacitors 22A-D, respectively.

Sampling mixers such as mixers 20A-D, facilitate allowing the LNA currents proportional to LNA input voltage to get integrated in sampling capacitors 22A-D for the time interval controlled by the LO. For example, for the interval t0 to t1, a charge is integrated into the sampling capacitor 22A; and the voltage on capacitor 22A at t1 represents a scaled version of LNA input integrated for the period proportional to LO. When the RF and LO frequencies differ by IF, then the output of the mixer represents the IF output sampled at LO frequency.

As described below, the signals that propagate through receiver 10 can be represented in complex notation. The signal received by mixers 20A and 20B from amplifier 18 is represented as A, and the signal received by mixers 20C and 20B from amplifier 18 is represented as jB. The local oscillator signal provided to mixers 20A and 20D is represented by the C and the local oscillator signal provided to mixers 20B and 20C is represented by jD, where C=D for an ideal circuit. Preferably, the local oscillator signals are switching waveforms phase delayed 90 degrees with respect to each other. At the end of time t1, the output of mixer 20A represents A*C and the output of mixer 20C represents B*D. At the end of time t2, the output of mixer 20B represents A*D and the output of mixer 20D represents B*C. The output of summer 34A gives (AC−BD). Subtraction is realized by applying AC and BD to the two inputs of a differential amplifier. The output of summer 34B represents (BC+AD).

Summing can be realized by transferring charges on capacitors 22A and 22C to a single capacitor. Thus the two outputs of summers 34A-B, i.e., lines 40A and 40B, represent an IF signal where RF input is multiplied by a single positive (or negative) frequency of LO. A succeeding complex band pass filter can completely remove the image. Before going through that step, another embodiment is described where many simplifications can be done to the implementation of the first embodiment described with reference to FIG. 3.

Figure 4:
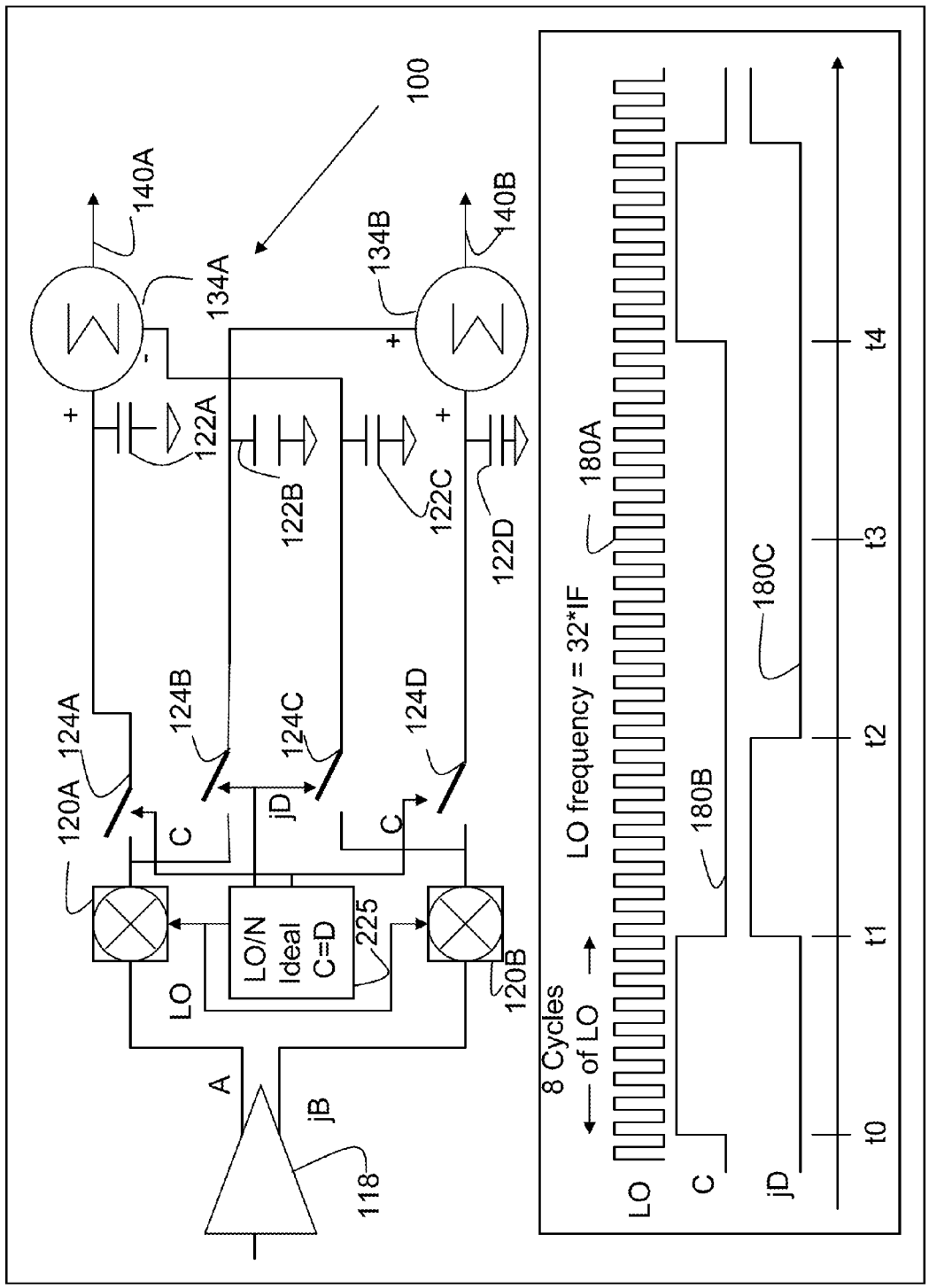
FIG. 4 is an electrical schematic general diagram of a digital receiver in accordance with another exemplary embodiment.

In another exemplary embodiment with reference to FIG. 4, the number of sampling mixers have been reduced to two by having a special relation between LO and IF. LO and IF are chosen to satisfy equations 1 and 2 below. This relation ensures that a single LO phase is sufficient to produce quadrature subproducts required for the complex multiplication.

Equations 1 and 2 are shown below.

$$f(LO)=4*N*f(IF) \text{ where } N=1,2,3 \quad \text{Eqn(1)}$$

where N is the averaging number, $$\text{and } f(LO) \pm f(RF) = f(IF) \quad \text{Eqn(2)}$$

For example, f(RF)=2400 MHz and f(LO)=2477.419 MHz and f(IF)=77.419 MHz. Here f(LO)=4*8*(77.419) MHz.

Thus, after the sampling mixer, if the resulting IF signal is accumulated (or integrated) for 8 cycles of LO, the resulting signal represents the quadrature sample of the IF (77.419 MHz). i.e., the resulting IF has time samples at the interval of 77.419*4=309.676 MHz.

With reference to FIGS. 3 and 4, receiver 100 of FIG. 4 is similar to receiver 10 discussed with reference to FIG. 3. Receiver 100 includes two mixers 120A-B instead of four mixers 20A-20D in Receiver 10. Receiver 100 advantageously utilizes proper sampling times to provide proper quadrature processing without requiring additional mixers. Receiver 100 includes an amplifier 118, local oscillator circuit 225, mixers 120A-B, switches 124A-D, capacitors 122A-D, and summers 134A-B. Mixers 124A-B are preferably sampling mixers.

Amplifier 118 provides a signal of A to mixer 120A and a signal of jB to mixer 120B. Mixers 120A-B also receive a local oscillator signal. The output of mixer 120A is coupled to switches 124A and 124B. The output of mixer 120B is coupled to switches 124C and 124D. Switch closings for switches 124A-D are controlled by the control signals applied at the control input of the switch.

FIG. 4 shows exemplary waveforms 180A, 180B and 180C. Waveform 180A depicts the LO signal. Waveform 180B is the control waveform (e.g., C) applied to switches 124A and 124D. Waveform 180C is the control waveform (e.g., jD, where C=D for an ideal circuit) applied to switches 124B and 124C. Control waveforms 180B-C toggle at a frequency of LO/N (e.g., N=8). Thus, switches 124A and 124D are closed for first 8 cycles of LO and the switches 124B and 124C are closed for next 8 cycles of LO.

Capacitors 122A-D are coupled between ground and a respective node between switches 120A-D and summer circuits 134A-B. The outputs of switches 124A and 124C are coupled to inputs of summer circuit 134A, and the outputs of switches 124B and 124D are coupled to the inputs of summer circuit 134B.

The voltage output of the capacitor 122A, at the end of time t1 represents a voltage proportional to LNA input integrated for N (in this example N=8) cycles of LO. Accordingly, the mixer output is filtered by a FIR low pass filter of length N=8. Similarly, the voltage output of the capacitor 122B, at the end of time t2 represents a voltage proportional to LNA input integrated for N (=8) cycles of LO. The waveforms at capacitor 122A and 122B represent quadrature samples of IF since IF and LO are related by equation 1. (In this example, one IF cycle contains 32 LO cycles.)

Switches 124A-D and the equation 1 allow generation of quadrature products without using four mixers. If LO waveform 180A can be construed as (C+jD), then the output at capacitor 122A is one quadrature sample of the down-converted, filtered IF, which is equal to A*C. Similarly, the output at capacitor 122B is next quadrature sample of the down-converted, filtered IF, which is equal to A*D. In the same way, the output at capacitor 122C is one quadrature sample of the down-converted, filtered IF, which is equal to B*D and the output at capacitor 122D is the next quadrature sample of the down-converted, filtered IF, which is equal to B*C.

Summer 134A receives the outputs from switches 124A and 124C. Summer 134B receives the outputs from switches 124B and 124D. The output of summer 134A represents (AC-BD) and the output of summer 134B represents (BC+AD). Together, outputs of both summers 134A-B, i.e., lines 140A and 140B represent (A+jB)*(C+jD). Summers 134A and 134B can be realized in the same way as summers 34A-B of receiver 10 (FIG. 3).

In this example, the IF output is at 77.419 MHz and its sampled outputs are available at 309.676 MHz (=77.419*4). The amplitude of this signal represents scaled version of LNA input. Also, the signal is FIR low-pass filtered with length N=8. The amount of filtering can be controlled by suitably changing N. When the IF is available with 4*IF sampling rate, standard DSP techniques can be applied. A succeeding complex band pass can completely remove the image of the outputs of summers 134A-B.

Figure 5A:
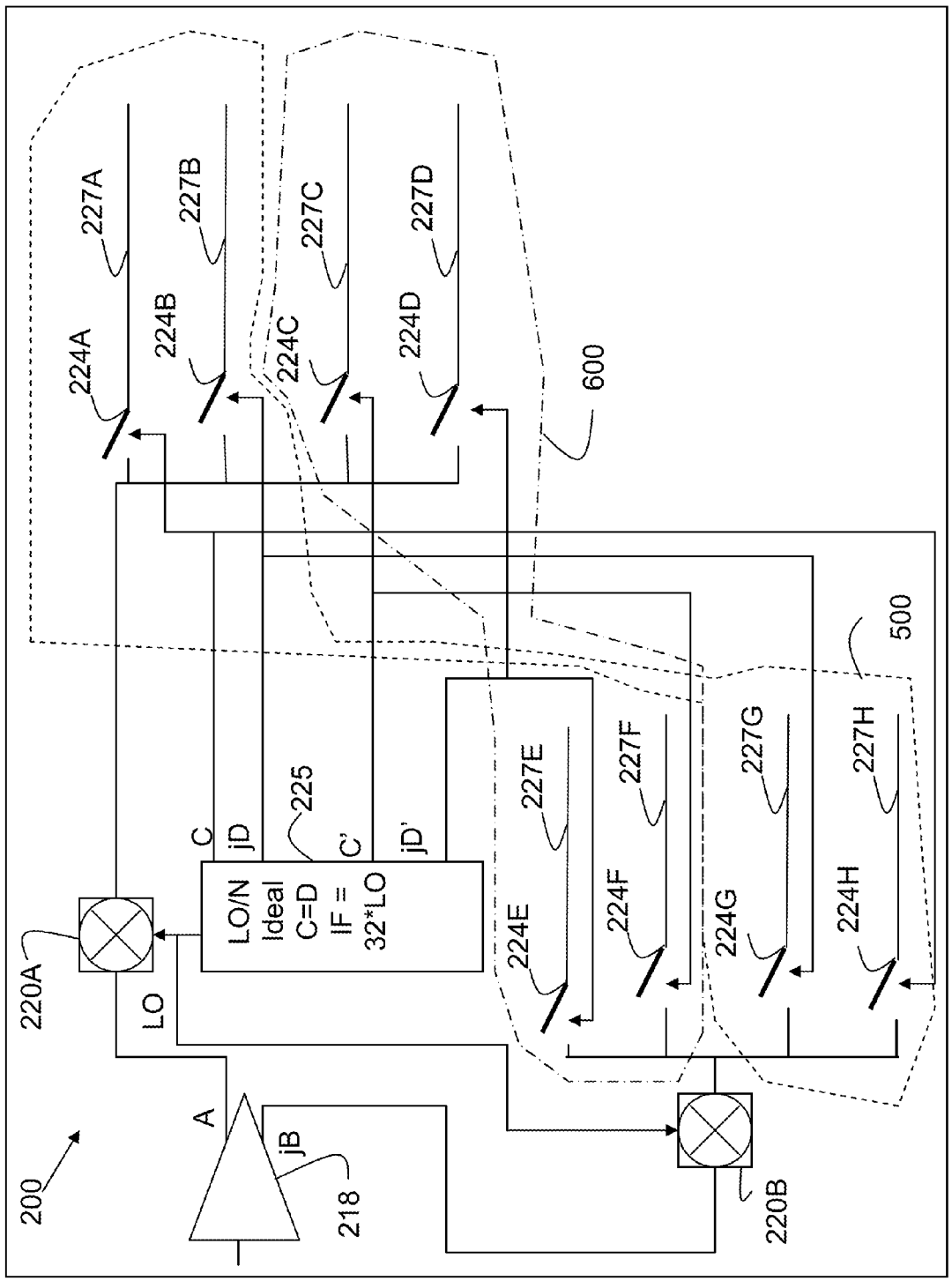
FIGS. 5A-C comprise an electrical schematic general diagram of a digital receiver in accordance with yet another exemplary embodiment.
Figure 5B:
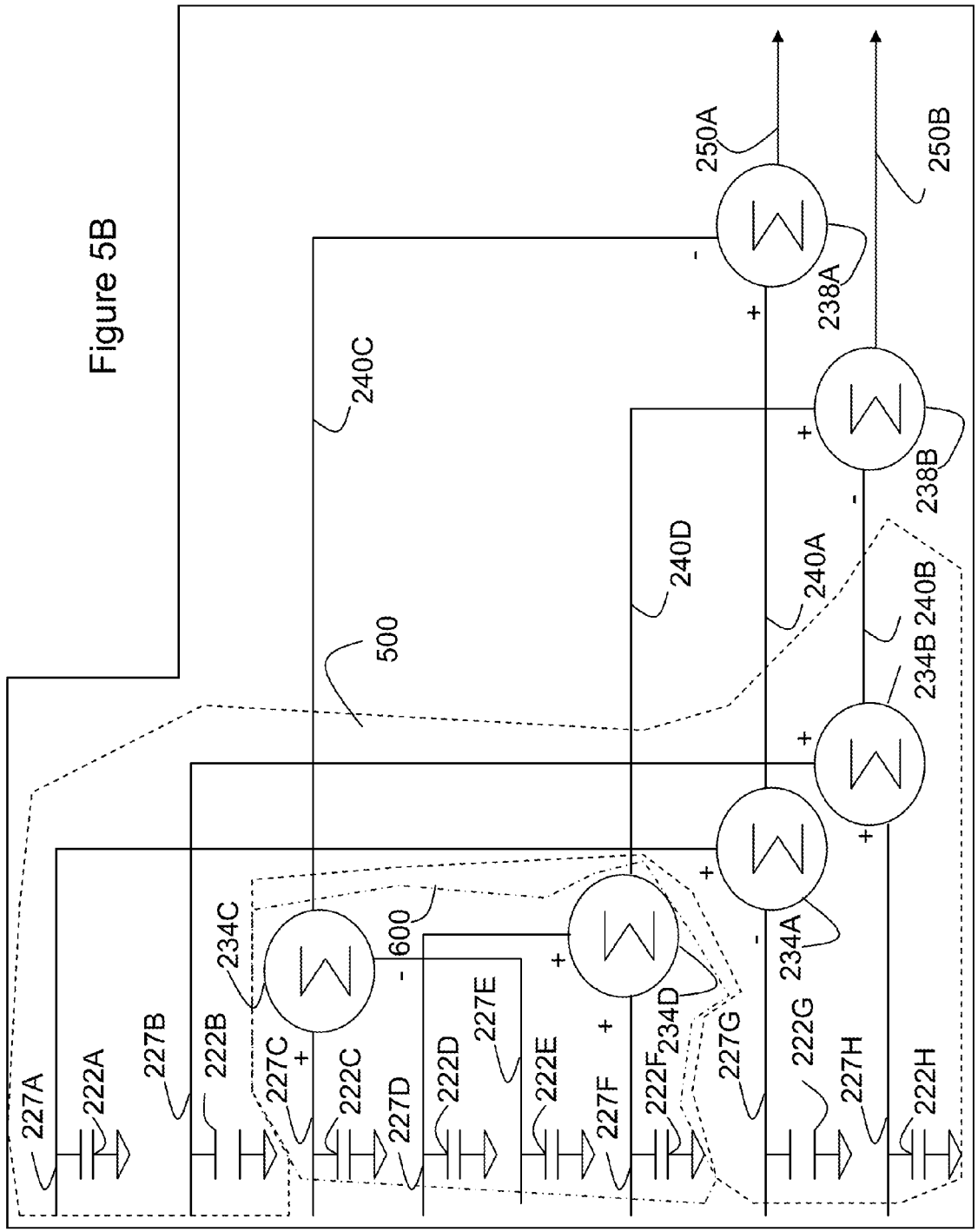
Figure 5C:
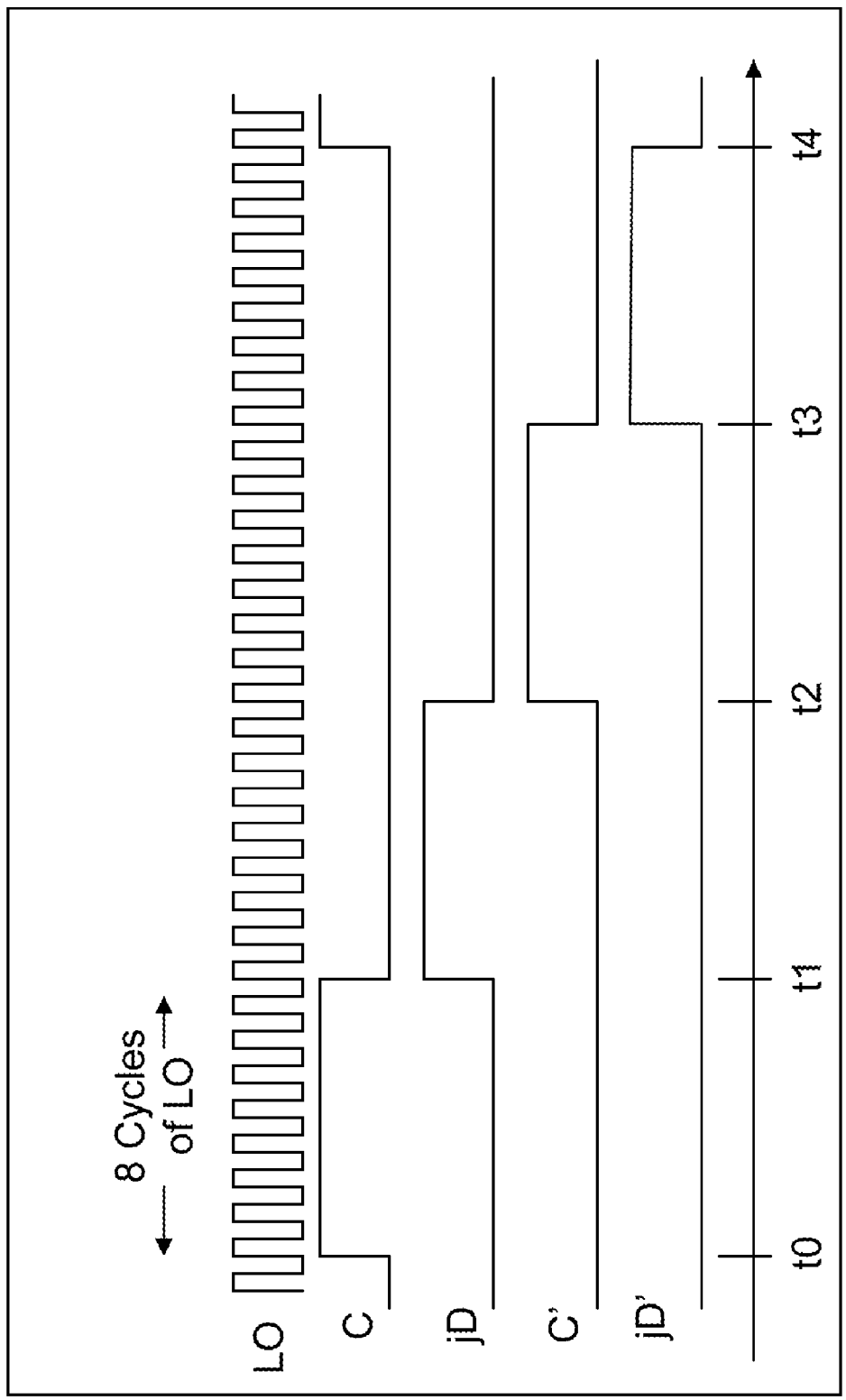

In another exemplary embodiment with reference to FIGS. 5A-C, along with complex multiplication, a complex bandpass filter function is added, thus completely removing the image frequencies. In this embodiment, the number of sampling mixers have been reduced to two by having a special relation between LO and IF. LO and IF are chosen to satisfy equations 1 and 2. This relation ensures that a single LO phase is sufficient to produce quadrature sub-products required for the complex multiplication.

For easy reference, equations 1 and 2 are again reproduced.

$$f(LO)=4*N*f(IF) \text{ where } N=1,2,3, \quad \text{Eqn}(1)$$

where N is the Averaging number.

$$\text{and } f(LO)+f(RF)=f(IF). \quad \text{Eqn}(2)$$

For example, f(RF)=2400 MHz and f(LO)=2477.419 MHz and f(IF)=77.419 MHz. Here, f(LO)=4*8*(77.419) MHz.

Thus, after the sampling mixer, if the resulting IF signal is accumulated (or integrated) for 8 cycles of LO, the resulting signal represents a quadrature sample of the IF (77.419 MHz). i.e., the resulting IF can have time samples at the decimated interval of (2477.419/8 or 77.419*4)=309.676 MHz.

With reference to FIGS. 5A-C, receiver 200 is very similar to receiver 100 discussed with reference to FIG. 4. In fact, the components contained within dashed lines 500 are identical to corresponding components in FIG. 4. As before, output of summers 234A and 234B represent the complex multiplied signal i.e., (A+jB)*(C+jD).

Components contained in dashed and dotted lines 600 accomplish complex multiplication of RF signal by LO, but on the remaining two quadrature phases.

These added sections realize the following equation:

$$(A+jB)*(C'+jD')=(AC'-BD')+j(BC'+AD') \quad \text{Eqn}(3)$$

where C' and D' represent the third and fourth quadrature phases of LO or $$\overline{LO}=(C'+jD')$$

Lines 240A and 240B represent complex multiplied RF input. Similarly, lines 240C and 240D represent complex multiplied RF input with opposite phase of LO.

Lines 240A and 240C are in anti-phase; and lines 240B and 240D are in anti-phase.

Thus, lines 240A-D represent quadrature phases (I,I',Q,Q') of the sampled IF signal.

Summer 238A is coupled to lines 240A and 240C; similarly, summer 238B is coupled to lines 240B and 240D. In essence, the summer 238A realizes the following equation:

$$(AC-BD)-(AC'+BD') \quad \text{Eqn (4)}$$

Summer 238B realizes the following equation:

$$(BC+AD)+(BC'+AD') \quad \text{Eqn (5)}$$

In FIGS. 5A-C, the implementation is shown with four differencer circuits (summers 234A and 234 C and summers 238A-B) and two addition circuits (Summers 234B and 234D). It can be advantageous to reduce the number of differencer circuits. By grouping the positive and negative terms separately, equation 3 can be realized with 4 addition circuits and 2 differencer circuits.

In general, to realize a band-pass filter, from low-pass filter's response, the FIR coefficients of the LPF are to be multiplied by complex frequency (e^j2*pi*f*t) where f is the center frequency of band-pass. When the sampling frequency is 4 times the IF frequency, the multiplication factor reduces to e^j*(pi/2)*M where M=1, 2, 3, 4 . . . . In the case of an ideal low pass filter, all the FIR tap coefficients are unity. Multiplying by e^j*pi/2*M amounts to multiplying the unity tap coefficients by a sequence, (+1,+j,−1,−j . . . ). Summers 238A-B can achieve this operation. This operation can be done for long number of samples to obtain sharper band-pass characteristics. By varying this length M, different band-pass filter characteristics can be obtained and the final output decimation frequency can be controlled.

Thus the RF input signal is complex multiplied by the LO and subsequently complex band-pass filtered. Hence the image frequency and all the negative frequencies can be completely removed. In the above method, different IFs can be chosen and different BPF characteristics can be chosen just by changing N and the length of final integration parameter (M).

Applicant believes that the architecture of receivers 10, 100 and 200 allows them to be made much less expensively than a conventional receivers. Applicant believes that receivers 10, 100 and 200 have lower power consumption than a conventional analog receiver.

It is understood that, while the detailed drawings, specific examples, and particular component values given describe preferred exemplary embodiments of the present invention, they serve the purpose of illustration only. The apparatus and method of the invention is not limited to the precise details and conditions disclosed. Further, although particular types of frequencies are discussed, various other values could be utilized. Other substitutions, modifications, changes, and omissions may be made in the design, operating conditions, and arrangement of the preferred embodiments without departing from the spirit of the invention as expressed in the appended claims.

What is claimed is:

1. A digital receiver configured to be coupled with an amplifier and a local oscillator, comprising:
   a first sampling mixer configured to receive a first amplifier output signal from the amplifier and a signal from the local oscillator, wherein a first mixer output of the first sampling mixer is provided to a first set of switches;
   a second sampling mixer configured to receive a second amplifier output signal from the amplifier and the signal from the local oscillator, wherein a second mixer output of the second sampling mixer is provided to a second set of switches, wherein the first amplifier output signal and the second amplifier output signal comprise a first complex signal; and
   a plurality of summers coupled to the first and the second sets of switches and configured to receive output signals from the first and second sets of switches.

2. The digital receiver of claim 1, wherein the local oscillator provides a first control signal and a second control signal for controlling switches in both the first and second sets of switches.

3. The digital receiver of claim 1, wherein the first control signal is phase delayed with respect to the second control signal, wherein the first control signal and the second control signal comprise a second complex signal.

4. The digital receiver of claim 2, wherein the period of the first and second control signals is an integer multiple N of the period of the signal from the local oscillator.

5. The digital receiver of claim 4, wherein the first mixer output and the second mixer output are filtered by a first and a second FIR low pass filter, respectively.

6. The digital receiver of claim 5, wherein the first and second FIR low pass filters have a length N.

7. The digital receiver of claim 2, wherein the first set of switches includes a first switch and a second switch and the second set of switches includes a third switch and a fourth switch, wherein the first control signal is provided for controlling the first and fourth switches and the second control signal is provided for controlling the second and third switches.

8. The digital receiver of claim 1, wherein the first amplifier output and the second amplifier output are phase delayed by 90 degrees with respect to each other.

9. The digital receiver of claim 2, wherein the local oscillator is configured to provide the first, the second, a third and a fourth control signal representing a first, a second, a third and a fourth quadrature phase of the local oscillator signal, respectively.

10. The digital receiver of claim 9, wherein a first portion of the first set of switches and a first portion of the second set of switches is controlled by the first control signal, wherein a second portion of the first set of switches and a second portion of the second set of switches is controlled by the second control signal, wherein a third portion of the first set of switches and a third portion of the second set of switches is controlled by the third control signal, wherein a fourth portion of the first set of switches and a fourth portion of the second set of switches is controlled by the fourth control signal.

11. The digital receiver of claim 1, wherein the plurality of summers provide a first sum and a second sum.

12. The digital receiver of claim 1, further comprising:
    a plurality of capacitors coupled to outputs of switches in the first and second sets of switches.

13. A method of digitally processing a communication signal, the method comprising:
    amplifying the communication signal;
    providing a first amplifier output signal to a first mixer and a second amplifier output signal to a second mixer, wherein the first amplifier output signal is phase delayed with respect to the second amplifier output signal;
    mixing the first amplifier output signal at the first mixer with a local oscillator signal and the second amplifier output signal at the second mixer with the local oscillator signal;
    providing the first mixer output to a first set of switches and the second mixer output to a second set of switches, wherein the first set of switches and the second set of switches are controlled by a plurality of control signals provided by the local oscillator;
    integrating the output of each switch in the first and second sets of switches;
    summing the integrated output of a first portion of the first set of switches with a first portion of the second set of switches to provide a first sum and the integrated output of a second portion of the first set of switches with a second portion of the second set of switches to provide a second sum.

14. The method of digitally processing the communication signal of claim 13, wherein the plurality of control signals includes a first control signal and a second control signal, wherein first control signal is phase delayed with respect to the second control signal.

15. The method of digitally processing the communication signal of claim 14, wherein the plurality of control signals includes a third and a fourth control signal, wherein the first, the second, the third and the fourth control signal represent a first, a second, a third and a fourth quadrature phase of the local oscillator signal, respectively.

16. The method of digitally processing the communication signal of claim 13, wherein the period of the plurality of control signals is an integer multiple N of the period of the local oscillator signal.

17. A method of digitally processing a communication signal, the method comprising:
    amplifying the received communication signal;
    providing a first amplifier output signal to a first and a second mixer and a second amplifier output signal to a third and a fourth mixer, wherein the first amplifier output signal is phase delayed with respect to the second amplifier output signal;

providing a first local oscillator output signal to the first and the fourth mixer and a second local oscillator output signal to the second and the third mixer;

mixing the first amplifier output with the first and second local oscillator output signals and mixing the second amplifier output signal with the first and second local oscillator output signals to produce a first mixer output, a second mixer output, a third mixer output and a fourth mixer output;

integrating the first mixer output the second mixer output, the third mixer output, and the fourth mixer output;

summing the integrated first mixer output with the integrated third mixer output to provide a first sum and the integrated second mixer output with the integrated fourth mixer output to provide a second sum.

18. The method of digitally processing the communication signal of claim 17, further comprising:

providing the first sum and the second sum to a complex filter.

19. The method of digitally processing the communication signal of claim 17, wherein the first sum is the result of a subtract operation.

20. The method of digitally processing the communication signal of claim 17, wherein the integration is performed using a plurality of sampling capacitors.

\* \* \* \* \*

UNITED STATES PATENT AND TRADEMARK OFFICE
CERTIFICATE OF CORRECTION

| | | |
|---|---|---|
| PATENT NO. | : 7,979,046 B2 | |
| APPLICATION NO. | : 12/334358 | |
| DATED | : July 12, 2011 | |
| INVENTOR(S) | : Sridharan | |

It is certified that error appears in the above-identified patent and that said Letters Patent is hereby corrected as shown below:

Column 9:
line 46, replace "claim 1" with --claim 2--.

Signed and Sealed this
Fourth Day of October, 2011

David J. Kappos
*Director of the United States Patent and Trademark Office*